United States Patent
Jung

(10) Patent No.: US 10,381,423 B2
(45) Date of Patent: Aug. 13, 2019

(54) MASK FRAME ASSEMBLY FOR ELECTRONIC DISPLAY DEVICE AND METHOD OF MANUFACTURING THE SAME

(71) Applicant: Samsung Display Co., Ltd., Yongin-si (KR)

(72) Inventor: Sungwoo Jung, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 175 days.

(21) Appl. No.: 15/591,045

(22) Filed: May 9, 2017

(65) Prior Publication Data

US 2017/0329216 A1    Nov. 16, 2017

(30) Foreign Application Priority Data

May 12, 2016  (KR) .................. 10-2016-0058186

(51) Int. Cl.
| | |
|---|---|
| *H01L 51/56* | (2006.01) |
| *H01L 27/32* | (2006.01) |
| *H01L 27/12* | (2006.01) |
| *C23C 14/04* | (2006.01) |
| *H01L 51/00* | (2006.01) |

(52) U.S. Cl.
CPC ...... *H01L 27/3246* (2013.01); *H01L 27/1288* (2013.01); *H01L 51/56* (2013.01); *C23C 14/042* (2013.01); *H01L 51/0011* (2013.01); *H01L 2227/323* (2013.01)

(58) Field of Classification Search
CPC .... C23C 14/042; H01L 51/0011; H01L 51/56
USPC .................. 118/720, 721; 430/320, 323
See application file for complete search history.

(56) References Cited

U.S. PATENT DOCUMENTS

| | | | | |
|---|---|---|---|---|
| 6,080,513 A | * | 6/2000 | Brugger | G03F 9/00 430/323 |
| 2002/0158570 A1 | | 10/2002 | Yamada et al. | |
| 2005/0199580 A1 | * | 9/2005 | Yang | C23C 14/042 216/12 |
| 2016/0047030 A1 | | 2/2016 | Obata et al. | |

FOREIGN PATENT DOCUMENTS

| | | |
|---|---|---|
| KR | 10-2002-0076192 | 10/2002 |
| KR | 10-2003-0085188 | 11/2003 |
| KR | 10-2012-0098020 | 9/2012 |
| KR | 10-2015-0049005 | 5/2015 |
| KR | 10-2015-0136043 | 12/2015 |

* cited by examiner

*Primary Examiner* — John A McPherson
(74) *Attorney, Agent, or Firm* — H.C. Park & Associates, PLC

(57) ABSTRACT

A mask frame assembly for an electronic display device includes a frame, and a mask coupled to the frame, in which the mask includes a pattern hole defining a first area over which material may be deposited, and a dam surrounding the pattern hole and defining a second area smaller than the first area over which the material may be deposited. A method of manufacturing a mask frame assembly for an electronic display device is also disclosed.

15 Claims, 9 Drawing Sheets

MASK FRAME ASSEMBLY FOR ELECTRONIC DISPLAY DEVICE AND METHOD OF MANUFACTURING THE SAME

CROSS-REFERENCE TO RELATED APPLICATION

This application claims priority from and the benefit of Korean Patent Application No. 10-2016-0058186, filed on May 12, 2016, which is hereby incorporated by reference for all purposes as if fully set forth herein.

BACKGROUND

Field

The invention relates generally to mask frame assemblies for making thin film semiconductor devices, and more particularly, to a mask frame assembly and a method of manufacturing the same which reduces the external shadow during a deposition process of manufacturing a display device and corresponding defects in the colors emitted by the pixels of the display.

Discussion of the Background

Organic light-emitting display devices generally include pixels each having a stacked structure including a pixel electrode as an anode, an opposite electrode as a cathode, and an emission layer between the pixel electrode and the opposite electrode. Images are displayed in color when holes and electrons, injected respectively from the anode and the cathode, recombine in the emission layer, thereby emitting light.

Each of the pixels may be a sub-pixel of one of, for example, a red pixel, a green pixel, and a blue pixel, and a desired color may be realized via a combination of these three color sub-pixels. In other words, each sub-pixel has a structure in which an emission layer that emits light of a red, green, or blue color is interposed between two electrodes, and color of a unit pixel is realized via an appropriate combination of the lights of these three colors.

The area of each sub-pixel is defined by a pixel defining layer, and the emission layer is formed within the defined area. The emission layer is generally formed using a deposition process. A mask frame assembly having the same pattern holes as the thin film pattern of an emission layer to be formed is arranged on a substrate. The thin film of an emission layer having a desired pattern is formed by depositing the raw material of the thin film onto the substrate via the pattern holes.

However, during the deposition process, the thin film pattern of the emission layer may not be accurately deposited within the area of the pattern holes of the mask frame assembly but may be deposited within the areas outside the pattern holes, and thus an external shadow may occur. The external shadow may cause color mixing between adjacent sub-pixels, and thus the resulting display product may have significant defects.

The above information disclosed in this Background section is only for enhancement of understanding of the background of the inventive concepts, and, therefore, it may contain information that does not form the prior art that is already known in this country to a person of ordinary skill in the art.

SUMMARY

Mask frame assemblies constructed according to the principles of the invention have a mask that reduces an external shadow created during a deposition process and reduces or effectively prevents color mixing between pixels.

Additional aspects will be set forth in the detailed description which follows, and, in part, will be apparent from the disclosure, or may be learned by practice of the inventive concepts.

According to one aspect of the invention, a mask frame assembly for an electronic display device includes a frame, and a mask coupled to the frame. The mask includes a pattern hole defining a first area over which material may be deposited, and a dam surrounding the pattern hole and defining a second area smaller than the first area over which the material may be deposited.

The dam may include a barrier wall may completely surround the pattern hole without gaps.

The pattern hole may include a plurality of pattern holes and the dam may include a plurality of barrier walls, and each of the plurality of the barrier walls may surround one of the plurality of pattern holes in a one-to-one correspondence.

The dam may be disposed on a surface of the mask facing a substrate on which the material may be deposited through the pattern hole.

The dam may be spaced apart from the substrate during a deposition process.

A spacer for maintaining a distance between the substrate and the mask may protrude from the substrate toward the mask, and a height of the dam may be less than a height of the spacer.

The spacer may maintain the distance due to contact with the surface of the mask facing the substrate, and the dam may protrude outwardly the surface of the mask toward the substrate.

The mask may further comprise a groove formed on the surface of the mask facing the substrate. The spacer may maintain the distance due to insertion into the groove, and the dam may be defined as a portion of the mask adjacent to the pattern hole, the portion of the mask being defined by the groove and being on substantially the same level with the surface of the mask.

According to another aspect of the invention, a method of manufacturing a mask frame assembly for an electronic display device includes providing a mask, forming a dam on the mask defining a first area over which material may be deposited, forming a pattern hole in the mask, the pattern hole being surrounded by the dam and defining a second area greater than the first area over which the material may be deposited, and coupling the mask to a frame.

The step of forming the dam on the mask may include forming a barrier wall on the mask using a first photoresist, and the step of forming the pattern hole in the mask may include forming the pattern hole surrounded by the barrier wall in the mask using a second photoresist.

The step of forming the dam in the mask may include forming a barrier wall completely surrounding the pattern hole without gaps.

The step of forming the pattern hole may include forming a plurality of pattern holes and the step of forming the dam may include forming a plurality of barrier walls, and each of the plurality of the barrier walls may be formed to surround one of the plurality of pattern holes in a one-to-one correspondence.

The dam may be formed on a surface of the mask facing a substrate on which the material may be deposited through the pattern hole.

The step of forming the dam may include forming the dam with a height. The dam may be spaced apart from the substrate during a deposition process.

A spacer for maintaining a distance between the substrate and the mask may protrude from the substrate toward the mask, and the step of forming the dam may include forming the dam with a height less than a height of the spacer.

The spacer may maintain the distance due to contact with the surface of the mask facing the substrate, and the dam may protrude from the surface of the mask toward the substrate.

The method may further include forming a groove on the surface of the mask facing the substrate, and inserting the spacer into the groove to maintain the distance. The step of forming the dam may include forming a portion of the mask adjacent to the pattern hole.

The step of forming the dam may include forming the dam between the groove and an opening defined by the pattern hole.

The step of forming the dam may include forming the dam in substantially the same plane as the surface of the mask facing the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
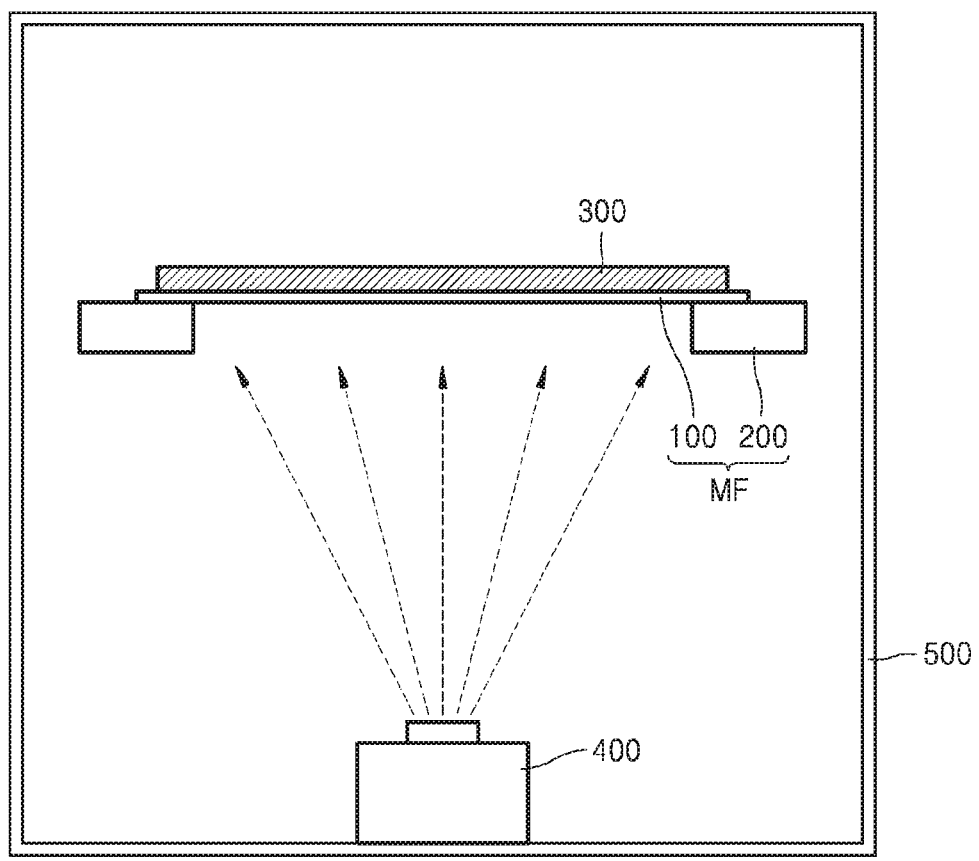
FIG. 1 is a schematic side view of a thin film deposition apparatus including a mask frame assembly constructed according to the principles of the invention illustrating a exemplary deposition process.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, a thin film deposition apparatus includes the mask frame assembly MF for forming a desired pattern on a substrate 300, which is a deposition target, and a deposition source 400 that ejects a deposition gas toward the substrate 300 within a chamber 500.

Accordingly, when the deposition source 400 ejects the deposition gas within the chamber 500, the deposition gas may be deposited on the substrate 300 via the mask frame assembly MF, and thus a thin film having a predetermined pattern may be formed.

Figure 2:
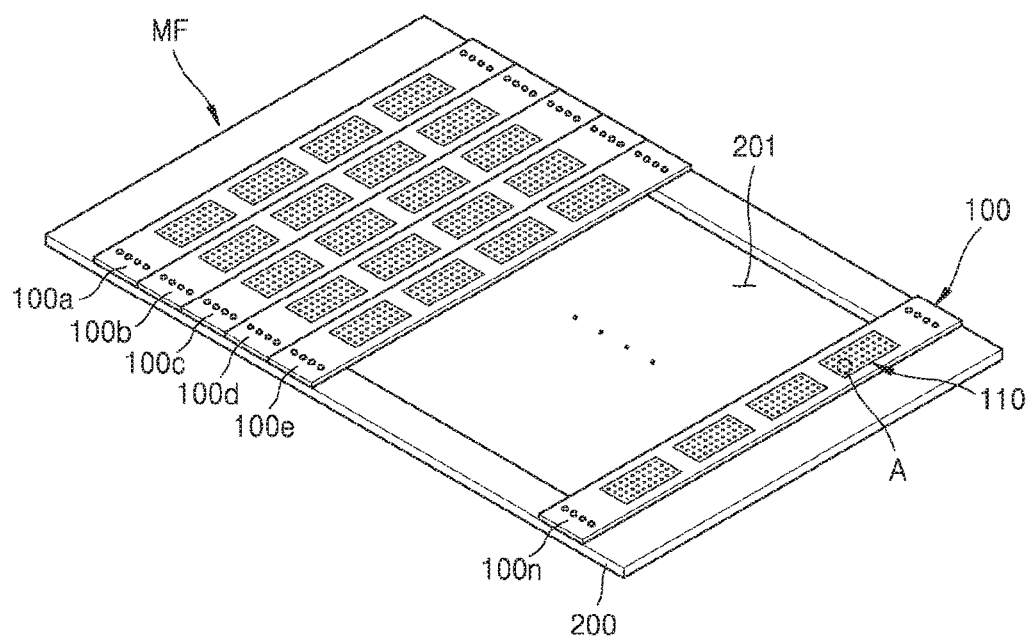
FIG. 2 is a perspective view of the mask frame assembly of FIG. 1.

Referring to FIGS. 1 and 2, the mask frame assembly MF according to the illustrated embodiment includes a frame 200, and a plurality of individual masks 100 whose ends are both fixed to the frame 200.

The frame 200 forms an outer structure of the mask frame assembly MF, and may have a rectangular shape having an opening 201 formed at its center. Both ends of each of the masks 100 are fixed to a pair of facing sides via a secure process such as welding.

Each mask 100 is a long stick-shaped member, and includes a plurality of pattern units 110 located within the opening 201. As described above, the both ends of each mask 100 may be welded or otherwise fixedly secured to the frame 200. The mask 100 may be made as a single large member, instead of a plurality of members, but, in this case, sagging due to a self-weight may become severe. Thus, as shown in FIG. 2, the mask 100 is formed as a plurality of individual masks 100a-100n having a stick shape. The mask 100 may be formed of, for example, nickel (Ni) or a Ni-cobalt alloy.

Each pattern unit 110 includes a pattern hole 111 formed therein. As deposition vapor passes through the pattern hole 111 during deposition, a thin film layer is formed on the substrate 300 (see FIG. 1).

Figure 3:
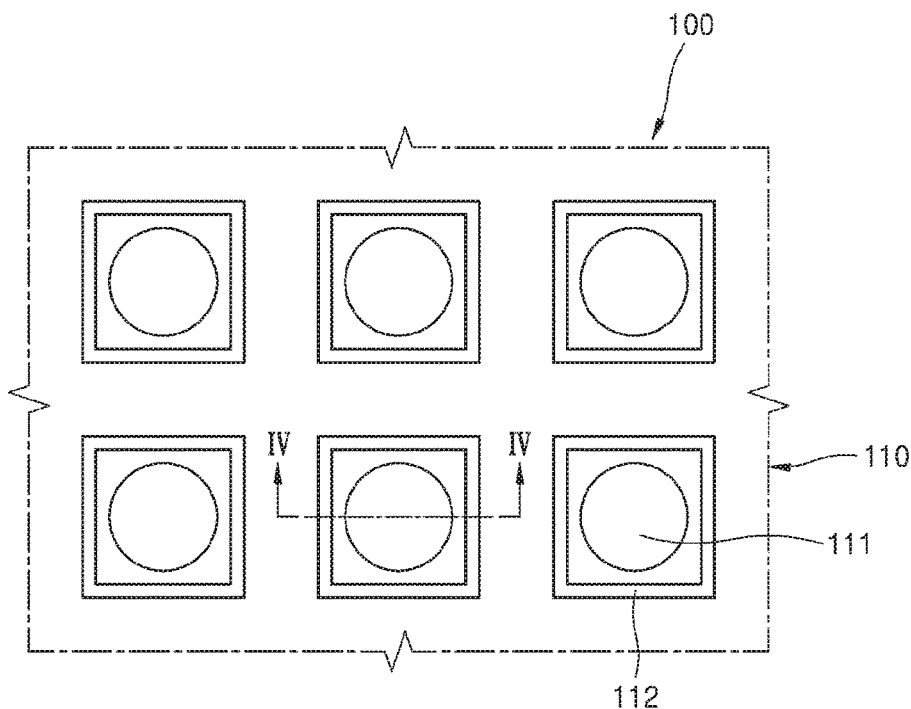
FIG. 3 is an enlarged schematic plan view of portion A of a mask of the mask frame assembly of FIG. 2.
Figure 4:
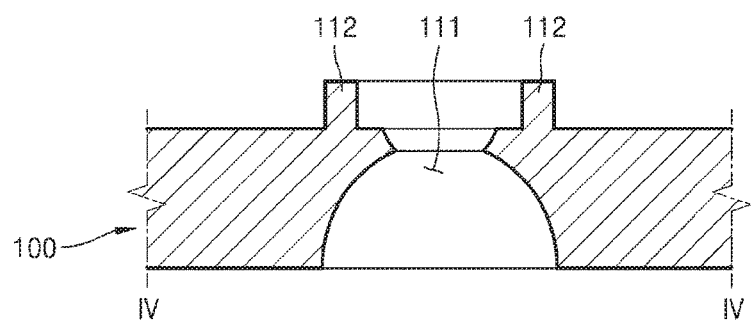
FIG. 4 is a cross-sectional view of the mask of FIG. 3 taken along sectional line IV-IV of FIG. 3.

As shown in FIGS. 3 and 4, a barrier wall 112 is formed around the pattern hole 111.

Referring to FIGS. 3 and 4, the barrier wall 112 protrudes upwardly from the top surface of the mask 100 at an angle, such as 90 degrees, and completely surrounds the pattern hole 111 of the pattern unit 110 without gaps. When view in plan, the barrier wall may have an annular, square, rectangular or other shape. The barrier wall 112 may immediately effectively reduce an external shadow during deposition. In other words, since the mask 100 is located between a deposition source and the substrate during deposition, deposition gas enters the pattern hole 111 from below the mask 100 and passes through the pattern hole 111 toward the barrier wall 112. At this time, the barrier wall 112 may blocks the gas and thereby controls the deposition area such that it does not greatly exceed the area over which deposition material may be deposited through the pattern hole 111, thereby suppressing an external shadow. This effect described subsequently in more detail in conjunction with a comparative example in FIGS. 7A-7B.

The mask frame assembly MF may be used for various thin film deposition processes, for example, for forming emission layer patterns of organic light-emitting display devices.

Figure 5:
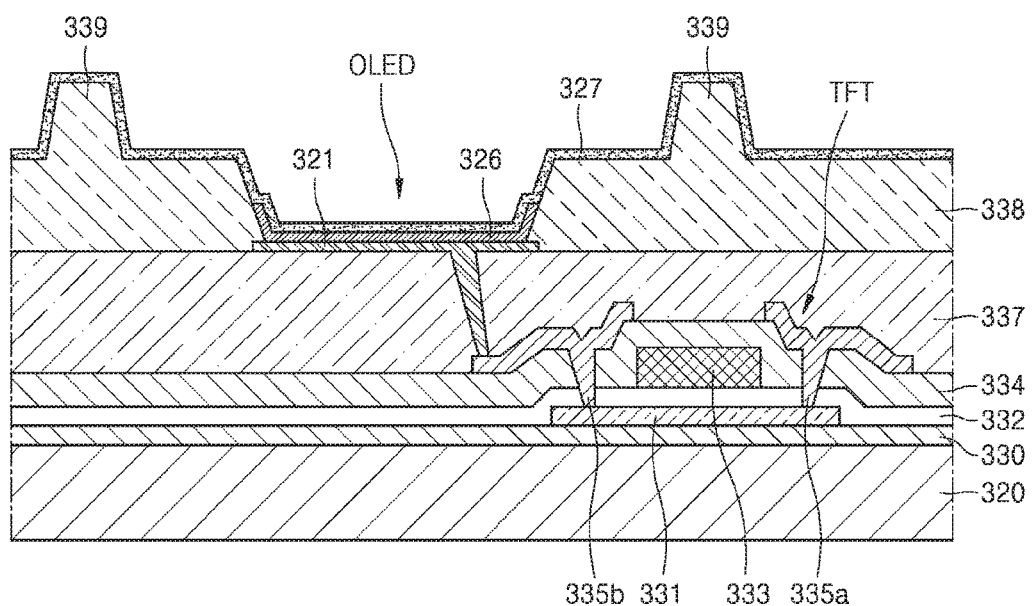
FIG. 5 is a cross-sectional view of an exemplary organic light-emitting display device including a substrate, which may be produced from a deposition process using the mask frame assembly of FIG. 2.

Referring to FIG. 5, a buffer layer 330 is formed on a base plate 320, and a thin film transistor TFT is disposed over the buffer layer 330.

The thin film transistor TFT includes an active layer 331 disposed on the buffer layer 330, a gate insulating layer 332 covering the active layer 331, and a gate electrode 333 on the gate insulating layer 332.

An interlayer insulating layer 334 covers the gate electrode 333, and a source electrode 335a and a drain electrode 335b are formed on the interlayer insulating layer 334.

The source and drain electrodes 335a and 335b respectively contact a source region and a drain region of the active layer 331 through contact holes in the gate insulating layer 332 and the interlayer insulating layer 334.

A pixel electrode 321 of an organic light-emitting device OLED is connected to the drain electrode 335b. The pixel electrode 321 is formed on a planarization layer 337, and a pixel defining layer 338 defining sub-pixel regions is formed on the pixel electrode 321. Reference numeral 339 indicates spacers for preventing damage of members on the substrate 300 due to contact with the mask 100 by keeping a distance from the mask 100 during deposition. The spacers 339 may be protrusions of a portion of the pixel defining layer 338. Then, an emission layer 326 of the organic light-emitting device OLED is formed in openings of the pixel defining layer 338, and an opposite electrode 327 is formed on the emission layer 326 using a deposition process. In other words, each opening formed in the pixel defining layer 338 is an area of a sub-pixel, such as a red pixel (R), a green pixel (G), and a blue pixel (B), and an emission layer 326 of a color corresponding to the sub-pixel is formed within the opening.

Accordingly, when the mask 100 of the mask frame assembly MF is arranged such that the pattern hole 111 of the pattern unit 110 faces the emission layer 326, an emission layer 326 having a desired pattern may be formed using a deposition process as described above with reference to FIG. 1.

Figure 6:
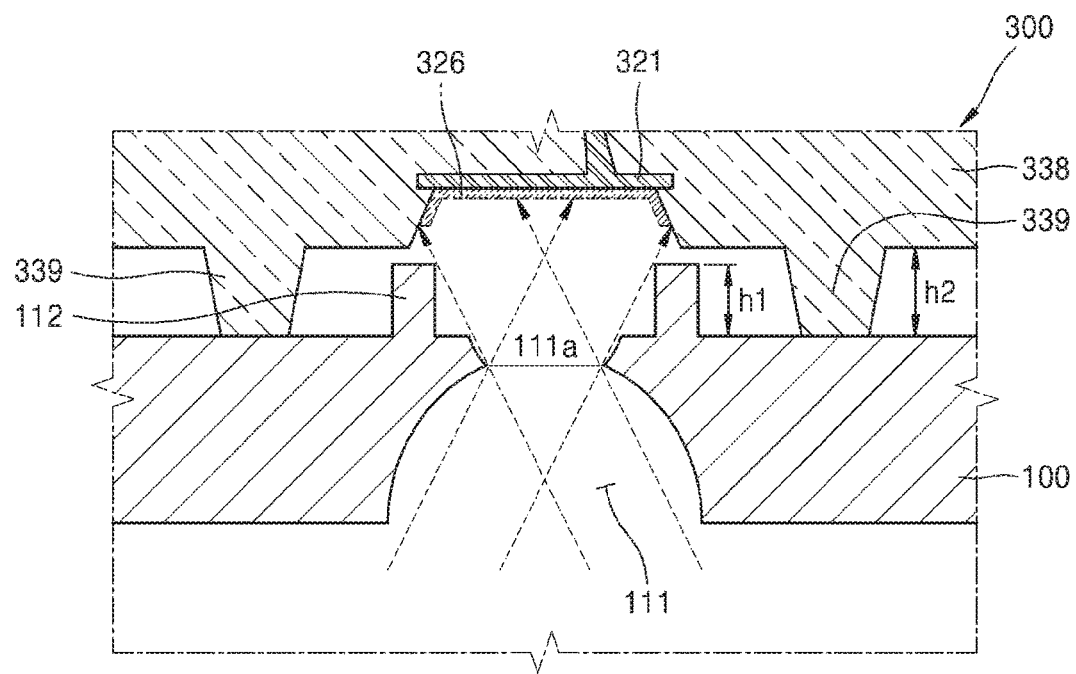
FIG. 6 is a cross-sectional view of the mask of FIG. 4 and the substrate of FIG. 1 showing a deposition process used to form an emission layer on the substrate of FIG. 5.

The effect of the barrier wall 112 may be seen again in FIG. 6. In other words, when deposition is performed for the emission layer 326, the mask 100 of the mask frame assembly MF and the substrate 300 are arranged as shown in FIG. 6. At this time, the spacers 339 on the substrate 300 are closely adhered to a surface of the mask 100 that faces the spacers, thereby keeping a distance h2 between the substrate 300 and the mask 100. The height h2 of each of the spacers 339 is greater than a height h1 of the barrier wall 112 (h2>h1), and thus contact between the barrier wall 112 and the substrate 300, which may damage members on the substrate 300, may be prevented.

When deposition is conducted in this state, a deposition gas, which is material used to form the emission layer 326, passes through the pattern hole 111 of the mask 100 and is then deposited on the pixel electrode 321 within the opening of the pixel defining layer 338. At this time, the barrier wall 112 facing the substrate 300 restricts the range of deposit of the materials so that the deposition gas does not greatly deviate from the protruded area of the bottom opening (111a) of pattern hole 111 through which deposition material may be conducted.

In other words, because the barrier wall 112, completely or at least substantially surrounds the pattern hole 111, it serves as a dam or stop blocking the spread of the deposition gas and guiding it to be concentrated at a desired location. Accordingly, an external shadow in which a deposition gas deviates from a desired location and spreads to the outside of the desired location is reduced or prevented, and thus precision of a deposition pattern may improve.

Figure 7A:
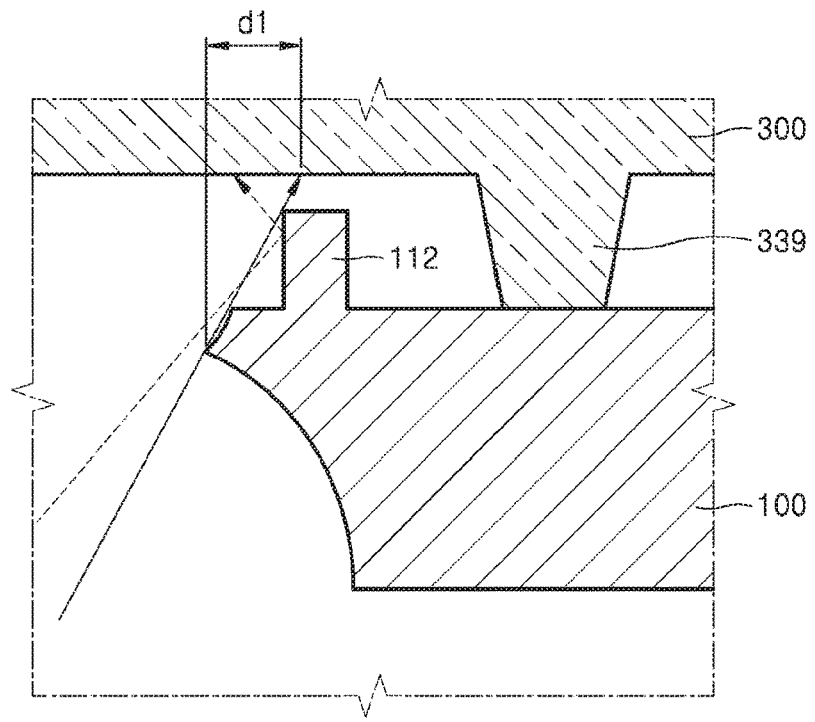
FIG. 7A is a cross-sectional view of the mask of FIG. 4 and the substrate of FIG. 1 showing how a barrier wall constructed according to the principles of the invention limits an external shadow created during deposition.
Figure 7B:
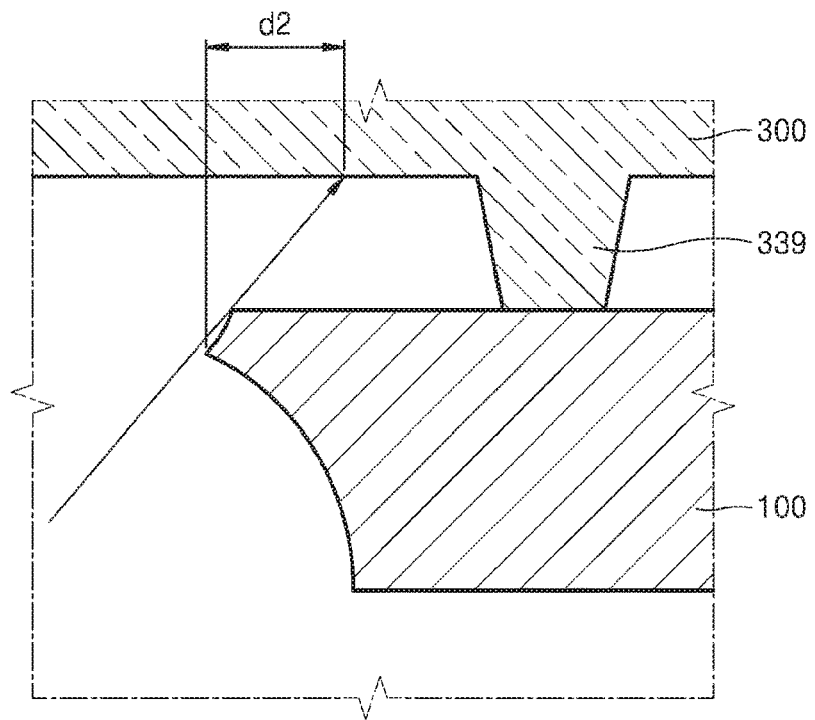
FIG. 7B is a cross-sectional view of the comparative example of mask and the substrate without a barrier wall showing an external shadow for comparison to the exemplary embodiment of FIG. 7A.

The degree of formation of an external shadow is compared between embodiments employing the inventive concepts and a comparative example in which no barrier wall 112 is included, with reference to FIGS. 7A and 7B, which illustrate the significant effect of the barrier wall 112.

In other words, as shown in FIG. 7A deposition gas is blocked by the barrier wall 112 and thus does not easily spread the outside of a desired location. Accordingly, an external shadow may be formed only in a very narrow region d1 near a pattern hole 111, and the risk of color mixing between adjacent sub-pixels may be very low.

However, as shown in FIG. 7B, in the comparative example which does not have a barrier wall 112, deposition gas smoothly spreads to the outside of a desired location, and thus an external shadow may be formed within a relatively large region d2 near the pattern hole 111, which is greater than d1 of FIG. 7A, and color mixing between adjacent sub-pixels may occur during deposition of an emission layer 326.

Accordingly, when the pattern holes 111 are surrounded by a barrier wall 112 according to the inventive concepts, generation of an external shadow may be prevented or reduced, and thus a problem, such as, color mixing between pixels, may be effectively prevented.

A mask 100 including a barrier wall 112 may be manufactured by a photoresist process as shown in FIGS. 8A to 8G.

Figure 8A:
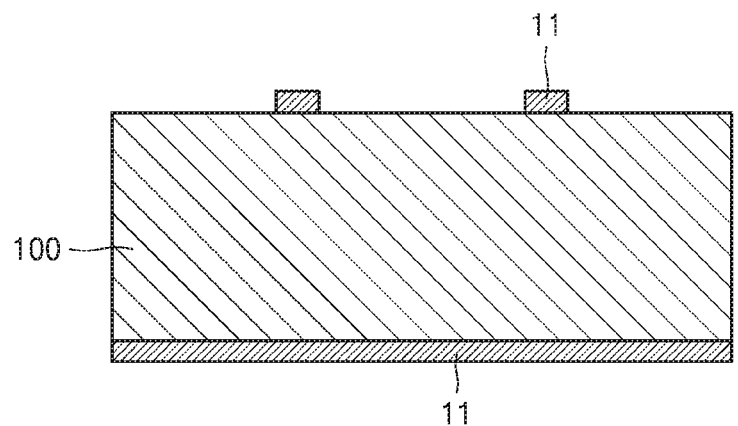
FIGS. 8A to 8G are schematic cross-sectional views of a mask sequentially illustrating a method of manufacturing barrier walls and pattern holes according to the principles of the invention.
Figure 8B:
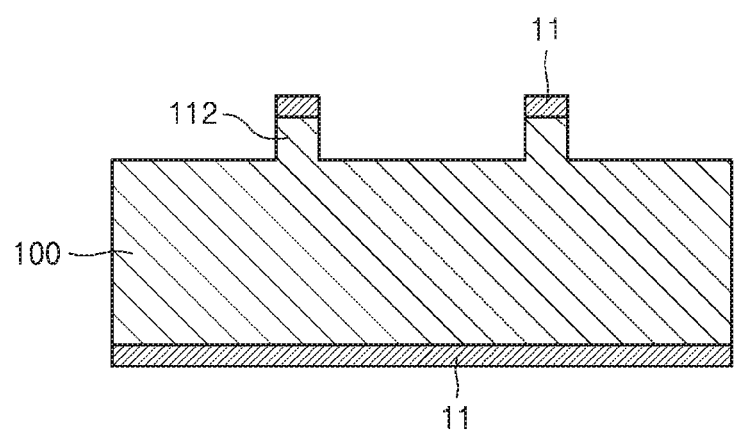

First, as shown in FIG. 8A, a first photoresist 11 is coated on the mask 100, and then the mask 100 is patterned to have the shape of a barrier wall 112. Thereafter, as shown in FIG. 8B, a primary photoresist process for etching is conducted. Accordingly, the barrier wall 112 is first formed on the mask 100.

Figure 8C:
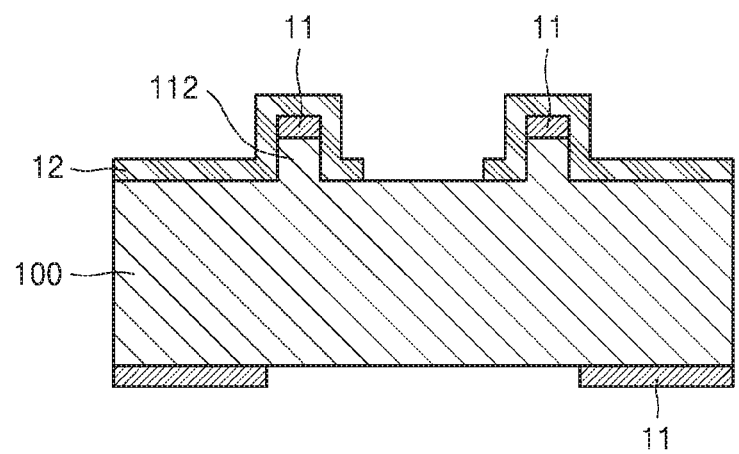
Figure 8D:
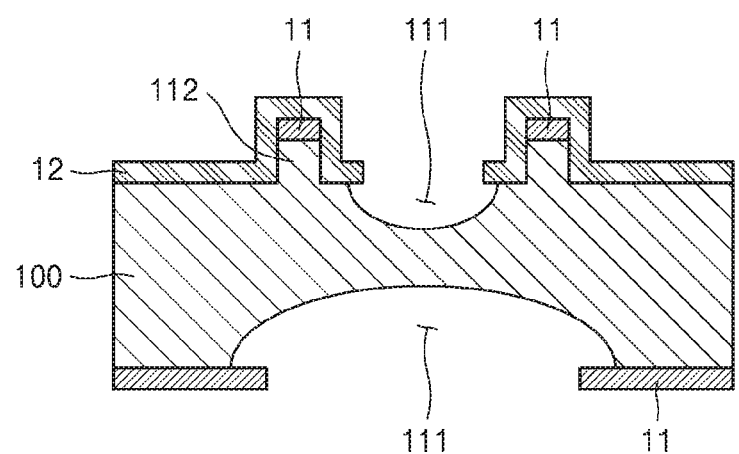

Then, as shown in FIG. 8C, a second photoresist 12 is coated, and is then patterned to have the shape of a pattern hole 111. Thereafter, as shown in FIG. 8D, a secondary photoresist process for etching is conducted. Then, the pattern hole 111 is formed, having the barrier wall 112 formed around an exit side of the pattern hole 111. At this time, the pattern hole 111 does not yet completely penetrate through the mask 100.

Figure 8E:
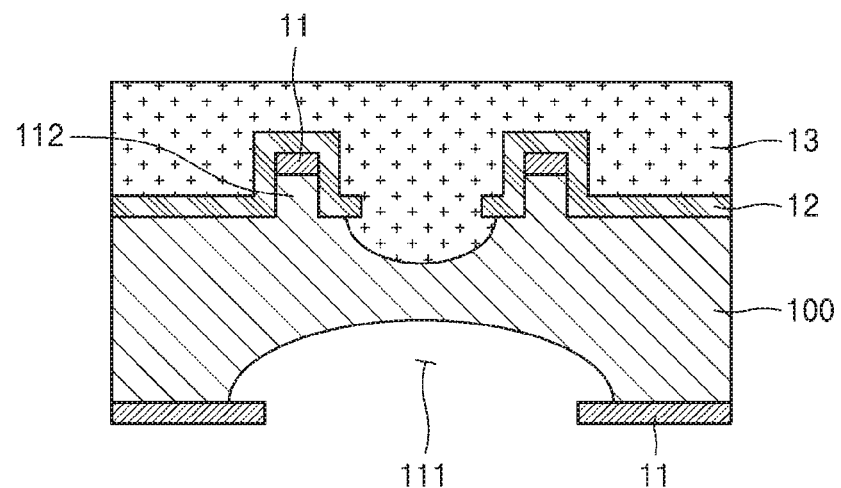
Figure 8F:
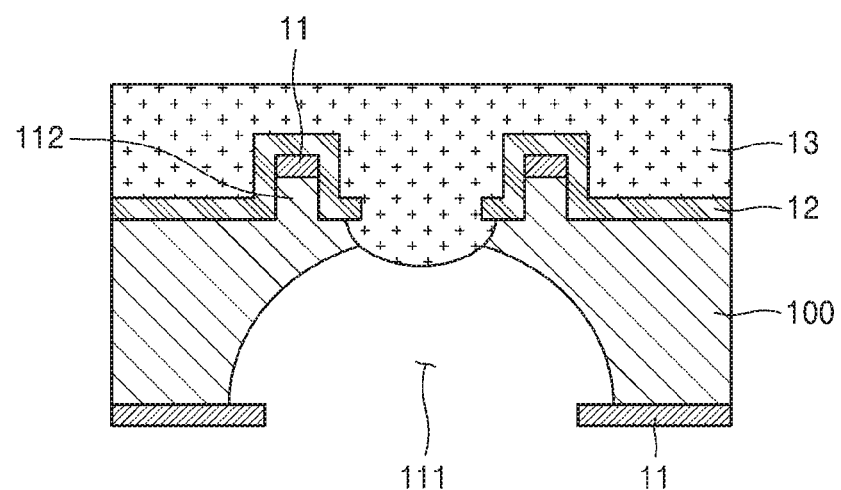

In this state, as shown in FIG. 8E, a protection resin 13 for preventing etching is formed on the exit side of the pattern hole 111 to protect the barrier wall 112 and the exit periphery of the pattern hole 111. Then, as shown in FIG. 8F, etching is conducted again, and thus the pattern hole 111 penetrating through the mask 100 is formed completely.

Figure 8G:
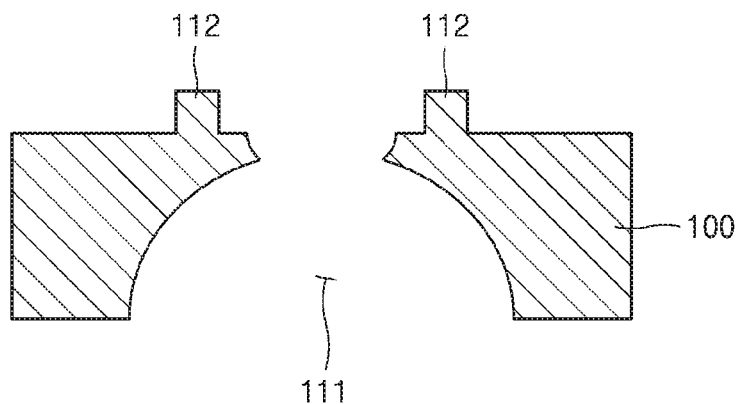

Then, as shown in FIG. 8G, when the first photoresist 11, the second photoresist 12, and the protection resin 13 are removed, the mask 100 in which the pattern hole 111 is completely surrounded by the barrier wall 112 without gaps may be obtained. The barrier wall 112 may be formed around the pattern hole 111 of the mask 100 as described above. The mask 100 manufactured in this way may be welded to the frame 200 and may form the mask frame assembly MF, as shown in FIG. 2.

Accordingly, a mask frame assembly MF capable of effectively suppressing an external shadow may be manufactured via this process.

Figure 9:
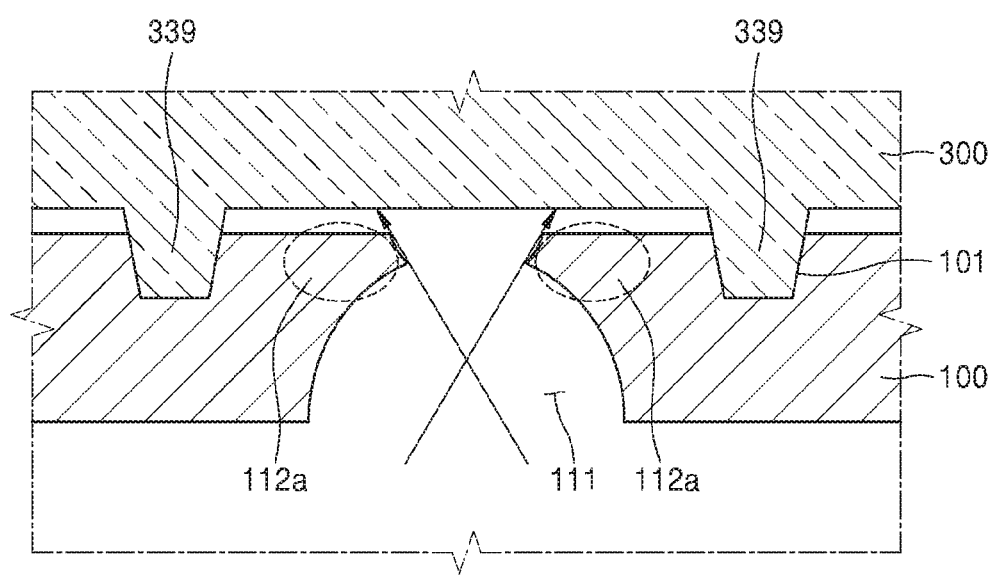
FIG. 9 is a cross-sectional view of another embodiment of a mask and the substrate constructed according to the principles of the invention.

According to the above-described exemplary embodiments, the barrier wall 112 protrudes upwardly from a surface of the mask 100 that faces the substrate 300. However, as shown in FIG. 9, according to another exemplary embodiment, grooves 101 may be formed on the mask 100 so that the spacers 339 are inserted into the grooves 101, and thus a portion of the mask 100 that is adjacent to the grooves 101 may serve as a barrier wall 112a.

In other words, when the grooves 101 are formed on the mask 100 and the spacers 339 of the substrate 300 are fit onto the grooves 101, the mask 100 is positioned on a relatively high level, and thus, even when the barrier wall 112 is not included, a portion of the mask 100 that is around the pattern hole 111 and adjacent to the substrate 300 serves as the barrier wall 112a. In this manufacturing process, the grooves 101 instead of the barrier wall 112 are formed in the primary photoresist process of FIGS. 8A and 8B, and its subsequent processes are the same as those in an exemplary embodiment. Accordingly, this modified structure may also effectively prevent an external shadow.

Therefore, according to a mask frame assembly and a method of manufacturing the same as described above, since an external shadow may be effectively prevented during a deposition process, a problem such as color mixing between sub-pixels in an organic light-emitting display device may be prevented. Thus, when the mask frame assembly constructed according to the principles of the invention is used during a deposition process, a stable quality of a product may be secured.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A mask frame assembly for an electronic display device comprising:

a frame; and a mask coupled to the frame, and comprising a pattern hole defining a first area over which material may be deposited; and a dam surrounding the pattern hole and defining a second area smaller than the first area over which the material may be deposited, the dam being located in a peripheral region spaced apart and disposed outwardly from the pattern hole.

2. The mask frame assembly of claim 1, wherein the dam comprises a barrier wall completely surrounds the pattern hole without gaps.

3. The mask frame assembly of claim 1, wherein:
the pattern hole comprises a plurality of pattern holes and the dam comprises a plurality of barrier walls, and
each of the plurality of the barrier walls surrounds one of the plurality of pattern holes in a one-to-one correspondence.

4. The mask frame assembly of claim 1, wherein the dam is disposed on a surface of the mask facing a substrate on which the material may be deposited through the pattern hole.

5. The mask frame assembly of claim 4, wherein the dam is spaced apart from the substrate during a deposition process.

6. The mask frame assembly of claim 5, wherein a spacer for maintaining a distance between the substrate and the mask protrudes from the substrate toward the mask, and a height of the dam is less than a height of the spacer.

7. The mask frame assembly of claim 6, wherein:
the spacer maintains the distance due to contact with the surface of the mask facing the substrate, and
the dam protrudes outwardly from the surface of the mask toward the substrate.

8. A method of manufacturing a mask frame assembly for an electronic display device, the method comprising:
providing a mask;
forming a dam on the mask defining a first area over which material may be deposited;
forming a pattern hole in the mask, the pattern hole being surrounded by the dam located in a peripheral region spaced apart and disposed outwardly from the pattern hole and defining a second area greater than the first area over which the material may be deposited; and
coupling the mask to a frame.

9. The method of claim 8, wherein:
the step of forming the dam on the mask comprises forming a barrier wall on the mask using a first photoresist, and
the step of forming the pattern hole in the mask comprises forming the pattern hole surrounded by the barrier wall in the mask using a second photoresist.

10. The method of claim 8, wherein the step of forming the dam in the mask comprises forming a barrier wall completely surrounding the pattern hole without gaps.

11. The method of claim 8, wherein:
the step of forming the pattern hole comprises forming a plurality of pattern holes; and
the step of forming the dam comprises forming a plurality of barrier walls, and
each of the plurality of the barrier walls are formed to surround one of the plurality of pattern holes in a one-to-one correspondence.

12. The method of claim 8, wherein the dam is formed on a surface of the mask facing a substrate on which the material may be deposited through the pattern hole.

13. The method of claim 12, wherein the step of forming the dam comprise forming the dam with a height,
wherein the dam is spaced apart from the substrate during a deposition process.

14. The method of claim 13, wherein a spacer for maintaining a distance between the substrate and the mask protrudes from the substrate toward the mask, and the step of forming the dam comprises forming the dam with a height less than a height of the spacer.

15. The method of claim 14, wherein:
the spacer maintains the distance due to contact with the surface of the mask facing the substrate, and
the dam protrudes from the surface of the mask toward the substrate.

* * * * *